United States Patent [19]

Warner

[11] 4,214,229

[45] Jul. 22, 1980

[54] REMOTE CONTROL APPARATUS

[76] Inventor: William J. Warner, 305 Memorial Dr., Suite 514A, Cambridge, Mass. 02139

[21] Appl. No.: 961,375

[22] Filed: Nov. 16, 1978

[51] Int. Cl.$^2$ ............................................. H04Q 9/00
[52] U.S. Cl. .................................. 340/148; 340/171 R
[58] Field of Search ............... 340/148, 167 A, 286 R, 340/365 C, 802, 171 R; 84/1.28

[56] References Cited

U.S. PATENT DOCUMENTS

| | | | |
|---|---|---|---|
| 3,241,115 | 3/1966 | Maling | 340/148 |
| 3,754,215 | 8/1973 | Blomenkamp | 340/167 A |
| 3,831,039 | 8/1974 | Henschel | 340/167 A |
| 3,848,249 | 11/1974 | Meiri | 340/286 R |
| 3,855,575 | 12/1974 | Leuschner | 340/148 |
| 4,112,429 | 9/1978 | Tsuha | 340/365 C |
| 4,114,142 | 9/1978 | Wycoff | 343/228 |
| 4,122,395 | 10/1978 | Schotz | 340/802 |

*Primary Examiner*—Harold I. Pitts

[57] ABSTRACT

A remote control device adapted to operate on a single remotely transmitted standardized command signal of a specific duration having a frequency within a predetermined frequency band, to actuate one or more control functions at the receiver, the receiver being equipped separately to indicate (a) when a signal within the correct frequency band is being received, and (b) when such a signal has been received for the specific duration. Means are provided at the receiver for changing the available command options automatically and so indicating to the transmitter, and for temporarily halting the command option changer upon the reception of a signal within the predetermined frequency range. Additional means are provided at the receiver for a series of command signals to be accepted by the receiver in such a way that the command option changer does not sequence to the next command option until the series of command signals is completed. Further means are provided to minimize interference from ambient sounds whereby the receiver will reject a predetermined number of standardized command signals, and provide an indication of that number.

18 Claims, 10 Drawing Figures

FIG. 1
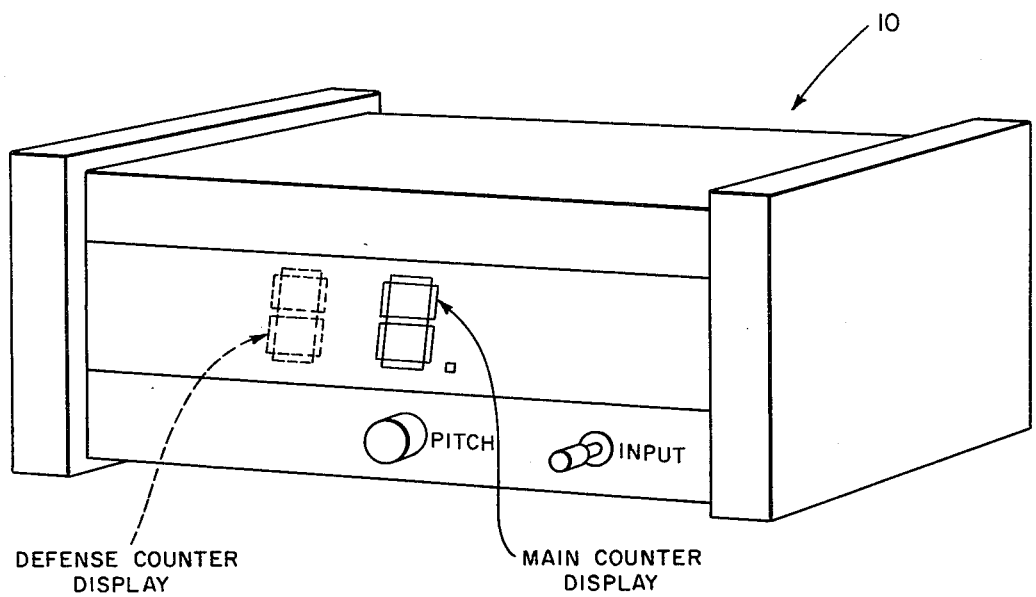
DEFENSE COUNTER
DISPLAY
MAIN COUNTER
DISPLAY
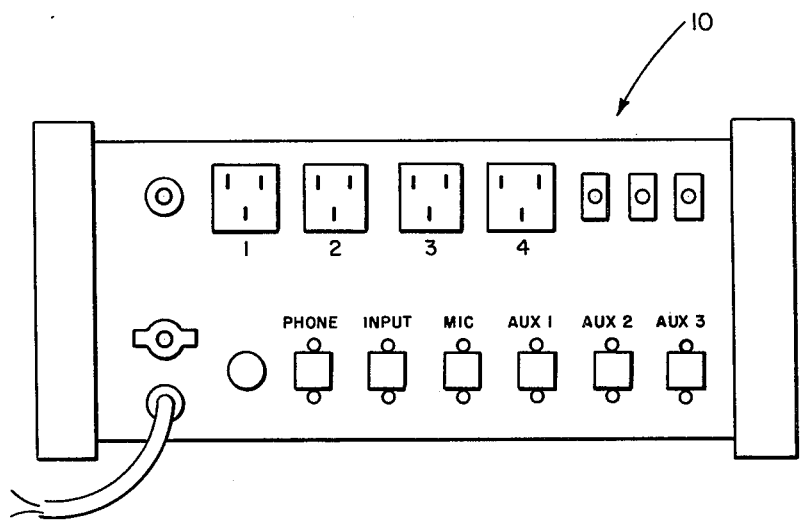
FIG. 2

SIGNAL INPUT PROCESSING SYSTEM
(PART ONE)

FIG. 5 SIGNAL INPUT PROCESSING SYSTEM (PART TWO)

MAIN LOGIC SYSTEM

PHONE SYSTEM

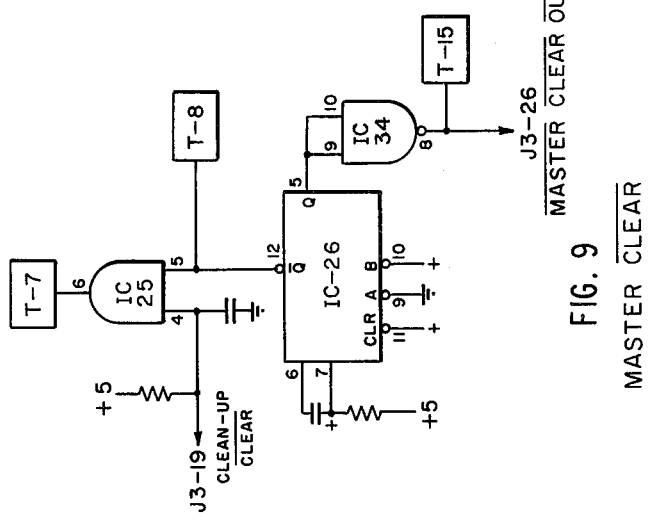
FIG. 9 MASTER CLEAR
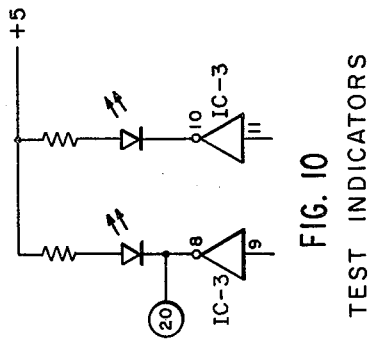
FIG. 10 TEST INDICATORS
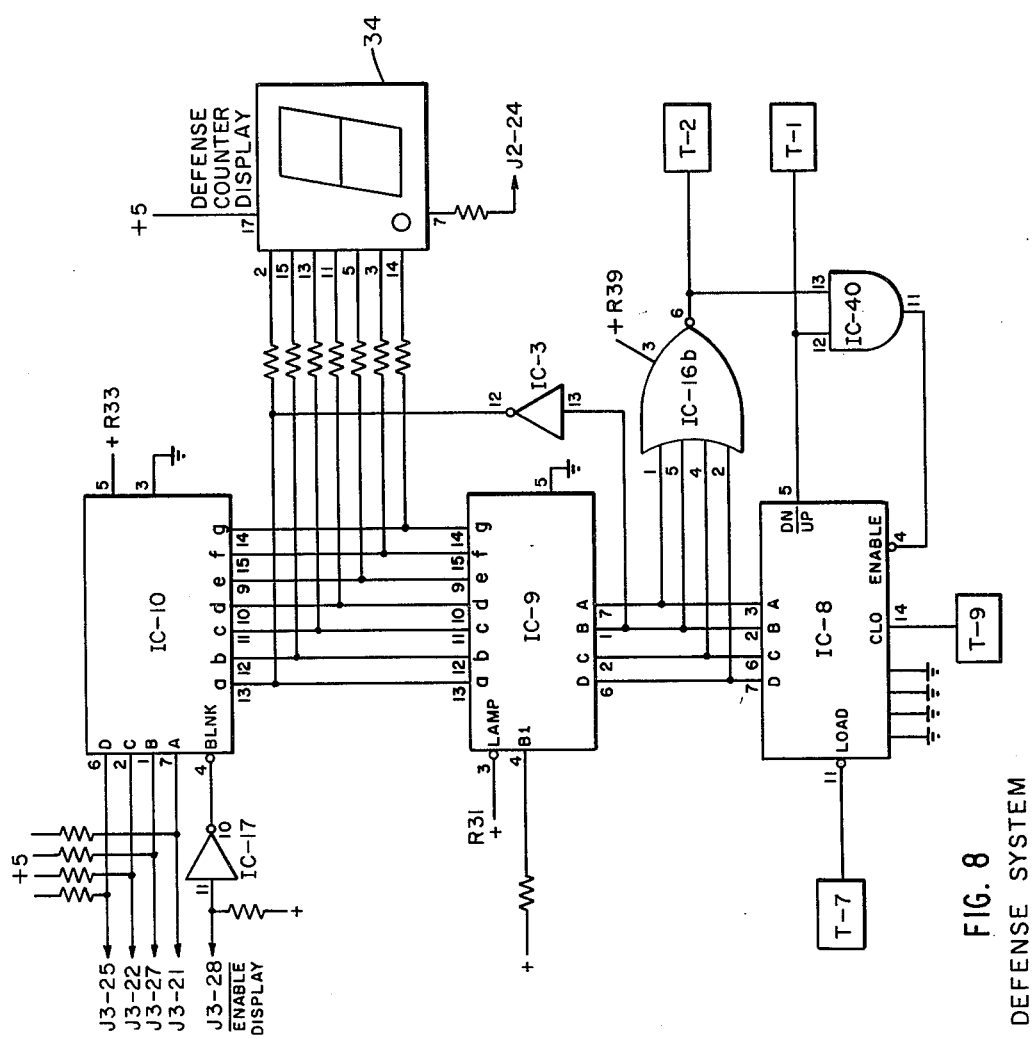
FIG. 8 DEFENSE SYSTEM

REMOTE CONTROL APPARATUS

FIELD OF THE INVENTION

This invention relates to remote control devices and more particularly to remote control devices adapted for convenient operation with a minimum of equipment at the remote station from which the controlling commands are issued, and a maximum of security of control. A typical application is a remote control device for use by a quadraplegic to permit him to call for assistance, or to operate a telephone, radio, television, tape recorder or the like, in a convenient manner and with a minimum of risk of environmental interference with the control.

BACKGROUND OF THE INVENTION

Remote control devices for operating various forms of equipment in response to transmitted signals go back many years (U.S. Pat. No. 1,844,177 (radios, lamps); U.S. Pat. No. 2,396,699, underwater mines; U.S. Pat. No. 2,433,845, relays; U.S. Pat. No. 3,829,683—computerized). Use of such equipments by disabled persons has likewise been suggested in the prior art (U.S. Pat. No. 3,286,031). A particularly relevant device for use by disabled persons was developed in the early 1970's at Bell Labs (see Bell Labs Record, Vol. 51, No. 7, Oct. 1973), by which the operator is able to dial a telephone or to operate one or two appliances by the mere creation of a noise at an appropriate time. The Bell Labs device employs a clock-like dial face equipped to illuminate the digits in timed sequence. The device is commanded by making a loud noise while a given light is illuminated, and reception of the signal at that instant causes the device to respond correspondingly to the number then illuminated. Thus, making the noise in coincidence with the illumination of a given number, or a given sequence of numbers provides a command. In one example, the device is described as using the sequence of sounds coincident with the illumination of numbers 3, 6, and 9 to initiate a telephone dialing sequence. After receipt of the initiating command, a red light adjacent to the dial face is illuminated and indicates to the operator that the device is ready to receive dialing instructions. Thereafter, the operator makes a loud noise as each of the numbers he wishes to dial becomes illuminated in sequence. A light in the center of the dial flashes momentarily to inform him that each number commanded has been received. When the completed telephone number has been fully entered, the operator waits until letter "D" on the dial face becomes illuminated, he then makes a loud noise, and again a second loud noise as the illumination proceeds to the next digit. This sequence causes an automatic dialer to take over and make the telephone call. Hanging up the telephone and various other functions are performed in response to commands given and processed in a similar way.

The Bell Labs device, however, has a number of serious drawbacks which have prevented its adoption. The major problem has to do with reception of false commands. In order for the Bell Labs device to work properly, the environment must be virtually free of random noise, because otherwise a false command will be entered, forcing the operator to erase what he has done and start over at the beginning of the command sequence. In other cases, a false entry coming from ambient noise or noise in a radio program can cause the interruption of the program. The Bell Labs device uses a coded initiating command procedure (e.g. the sequence of 3, 6, 9) to minimize the risks of false interruption, but this, in itself, is a drawback because of the extra time required to make the coded initiating entry.

Accordingly, a basic object of the present invention is to provide a remote control device which is extremely simple to control and which is virtually immune to false triggering and unintentional interruption of service. More detailed objectives are to provide a sound operated remote control which can operate in a normal sound environment including the sound of radio, television or taped programs—or normal voice transmissions, and accomplish this without the use of time consuming coding procedures. Another object is to provide a device in which commands for a multiplicity of functions can be accomplished using a single command without time consuming coding procedures.

BRIEF DESCRIPTION OF THE INVENTION

In the accomplishment of the foregoing objectives, in an illustrative embodiment of the invention, the remote transmitter issues a command signal at a specific frequency which signal is received at a receiver through a frequency detector tuned to that frequency. The transmission of the signal may be by sound, light, or electromagnetic means. In the illustrative embodiment, however, it is done by an ordinary human whistle. The operator knows in advance approximately the correct frequency and adjusts his whistle slightly up or down to reach the correct frequency. The receiver indicates to the operator when the correct frequency has been reached by the illumination of a light, which in the present illustration is done by the illumination of a decimal point on an alpha-numeric display panel. Thus, it is a feature of the present invention that the remote signal has a fairly narrow frequency band, the receiver has a corresponding fairly narrow range of reception, and the receiver is equipped to indicate to the transmitter when the transmission frequency comes within the frequency detector's reception range. In this way the transmission need not be loud and the transmission can be received despite the presence of other normal environmental noise. On the other hand, if there is noise in the environment which includes a significant level of sound coming within the specific frequency range of the detector, the operator is warned of the presence thereof by the appearance of the decimal point on the display. Although in order to reduce the hazard of false signals it may be desireable to narrow the range of frequencies which are capable of activating the receiver, as the frequency range is narrowed the whistler finds it more difficult to match the required frequency. Accordingly, a tone detector having a detection range of about 10% provides an optimum balance between frequency immunity and convenience to the user.

The relatively narrow frequency range of the transmission and reception together with the two-way communication between the transmitter and receiver is the first and basic means employed in the present invention for eliminating false commands. The second means for so doing employs time. Thus, when the decimal point is illuminated showing that the transmitter is at the correct frequency, the command will not become effective until the signal has remained within the correct frequency range for a pre-determined length of time. In the illustrative embodiment, a duration of ¾ sec. has been selected as a good balance. Of course, a longer time would render the device more immune to false commands, but longer times are more inconvenient to the whistler. When the whistle has remained at the correct frequency for the specified duration, a further signal emanates from the receiver informing the transmitter that he has successfully completed the command. This is done in the illustrative embodiment by causing the alpha-numeric display then showing to turn off momentarily, that is, to make a single, distinct blink. It is, therefore, a further feature of the invention that the second line of defense against false commands cooperates with the first by including signal duration to segregate random noise from command signal while permitting the transmitter to observe, by viewing the illuminated decimal point, that he is holding the correct frequency. The blink of the display further informs him both that he has held it long enough and that the command received corresponds to the alpha-numeric character present on the display at the time of the blink.

Variations in commands are provided by changing the alpha-numeric display referred to hereafter as the "main display". In the illustrative embodiment, the main display is arranged to present nine digits (0 to 8), each of which can represent a different function to be performed by means associated with the receiver. For example, it can control relays and other automatic equipment to: answer the telephone; dial the operator; turn on or off lights, radio, television, tape recorder; call a nurse; turn pages of a book; etc.

The digits are displayed sequentially and remain illuminated for about 1 sec. each. The operator becomes familiar with the function associated with each digit. When he desires a given function, he waits until that digit is illuminated and then gives the command by the sequence described above. In order to make it more feasible for the operator to succeed in transmitting the desired command at the desired time, a further delay means is employed which holds the main display at a given number for a finite time in the event that the transmitter has not succeeded in maintaining the proper pitch so as to light the decimal point for sufficient time to complete the command. In this way, the operator can see that his transmission has gone off frequency by the absence of the decimal point and he knows he has further time (i.e. 1 sec.) in which to try again before the main display will shift to another number. He can, of course, wait for the display to cycle around again, but it is more convenient if he can complete the command without such a delay. Accordingly, a further feature of the invention evolving from the interplay between transmitter and receiver is the use of a short delay of the change of command option together with means for signalling to the transmitter whether the frequency of the transmission is appropriate for reception.

Still another means for eliminating false commands is provided by using one of the specific command functions to bring into action a special protective arrangement. This is done in the illustrative embodiment by employing a specific digit, for example the "8" digit, for deactivating the normal response of the system to commands and for activating an auxiliary counter for counting and displaying the number of command signals received subsequent to the activation of the auxiliary counter. This auxiliary counter is called a "defense counter". Once it is activated, a second display comes on and is used to display the number of commands to be counted by the defense counter. The number displayed by the defense counter is established by the number of commands signalled while the main display is on "8". Once the operator has activated and loaded the defense counter the receiver remains inactive until it has received as many commands as the defense counter displays, and for each command it receives the display of the defense counter is reduced by 1. When the display of the defense counter reaches 0, normal operation resumes. The defense counter permits the operator to listen to a program in which, for example, a police siren or a flute may reach the correct pitch for transmitting a command to the receiver. After turning on the program, which he suspects might have sounds which can trigger the machine, the operator loads the defense counter by issuing commands when the main display is at number 8. While watching such a program, all the operator needs to do is to check his defense counter periodically to see that it is still "loaded". If the number on the defense counter is approaching 0, the operator can replenish the defense counter by issuing additional commands when the main display is at number 8. He can deactivate the defense counter by issuing the required number of commands when the main display is on any number other than 8.

Still another feature of the invention relates to means for providing the operator with additional options suitable for the type of function involved. For example, an operator will normally wish to turn off any noise creating appliance such as a radio, television, or stereo when he is answering the telephone. Thus the "answer the telephone" function can be supplemented with an additional means for deactivating other noisy appliances that may be in operation at the time that the telephone is being used. Another option designed to accommodate a specific function is a relatively long time delay after receipt of a command signal before the digits again start sequencing on the main display panel. This delay permits the operator to transmit additional command signals before the given function digit changes. For example, if the function is for television channel selection, or a page turner, the operator may wish to give a second or further commands without waiting for the main panel numbers to sequence around again to the digit representing that particular function. Similarly, answering the telephone needs an option for additional commands. In the illustrative embodiment, the first command issued when the main counter is at number 0 engages the telephone. A second command, if issued before the main display resumes sequencing, will cause the machine to dial the operator. A delay is needed to give the operator time to transmit this second signal. An extension of the same option is simply to deactivate the sequencing of the digits on the main display panel pending receipt of a second command signal. Such an option permits the operator to transmit the second signal instantaneously, since he knows that the digit on the main display panel has not changed. This option is useful when a user wishes to terminate a function, such as a tape recorder, immediately and accurately. The common feature of these options is that they extend the usefulness of particular functions according their own specialized needs. Thus a single signal of sufficient duration within a given convenient frequency range accomplishes a vast number of complicated operations, using means within the machine for sequencing its receptivity of commands, as well as tailoring its responses to suit the different needs of each command.

An advantage of using the concept of single input along with a slowly sequencing "main counter" is that additional control functions can be added simply by allowing the counter to sequence to a higher number, or to display letters also. For example, the illustrative embodiment has the capability to increase the number of command functions by displaying not only the numbers 0–8, but also the number 9, and letters A, B, C, D, E, and F. Thus, additional functions can be added with no change in the basic concept, and with correspondingly minimal extra hardware to accomplish the expansion.

A further advantage of the single input, main computer concept is its suitability for implementation by various hardware methods. In the illustrative embodiment, an approach was chosen which uses individual microcircuits to accomplish the various tasks within the system. (For example, the main counter, the delay timers, and all other internal functions are implemented by separate microcircuit packages). A different hardware embodiment embodies a microprocessor as the basic hardware element. In this case the specific tasks within the system are accomplished by only a few highly versatile hardware circuits together with interface circuitry. Thus two distinct hardware approaches can be used to arrive at the same result: individual hardware circuits to accomplish each task in the machine; of a few general purpose circuits specially programmed to accomplish the tasks in the machine. From the user's standpoint, the results are identical.

BRIEF DESCRIPTION OF THE DRAWINGS

The illustrative embodiment is depicted in the accompanying drawings in which:

FIG. 1 is a view in perspective of the receiver showing the front panel;

FIG. 2 is a view in side elevation of the rear panel;

FIG. 8 is a circuit diagram of the defense system;

FIG. 9 is a circuit diagram of the master clear, and

FIG. 10 is a circuit diagram for the test indicators.

GENERAL FUNCTIONAL DESCRIPTION OF ILLUSTRATIVE EMBODIMENT

The illustrative embodiment herein described is designed for use by a severely handicapped person and is arranged to permit him to control a large number of appliances (or the like) by the mere use of single whistle commands within a given frequency range for a specific duration. The equipment comprises a receiver indicated at 10 in FIG. 1 which is housed in a small box ($12\frac{1}{2}"\times 10"\times 5"$). The receiver receives commands from the user and, in response thereto, supplies power through appropriate connections on the rear panel (see FIG. 2) to appliances which are to be controlled (i.e. power to run a light or a television. Relay contact closures are also provided, which allows the machine to replace mechanical switches which its handicapped user cannot use).

Figure 3:
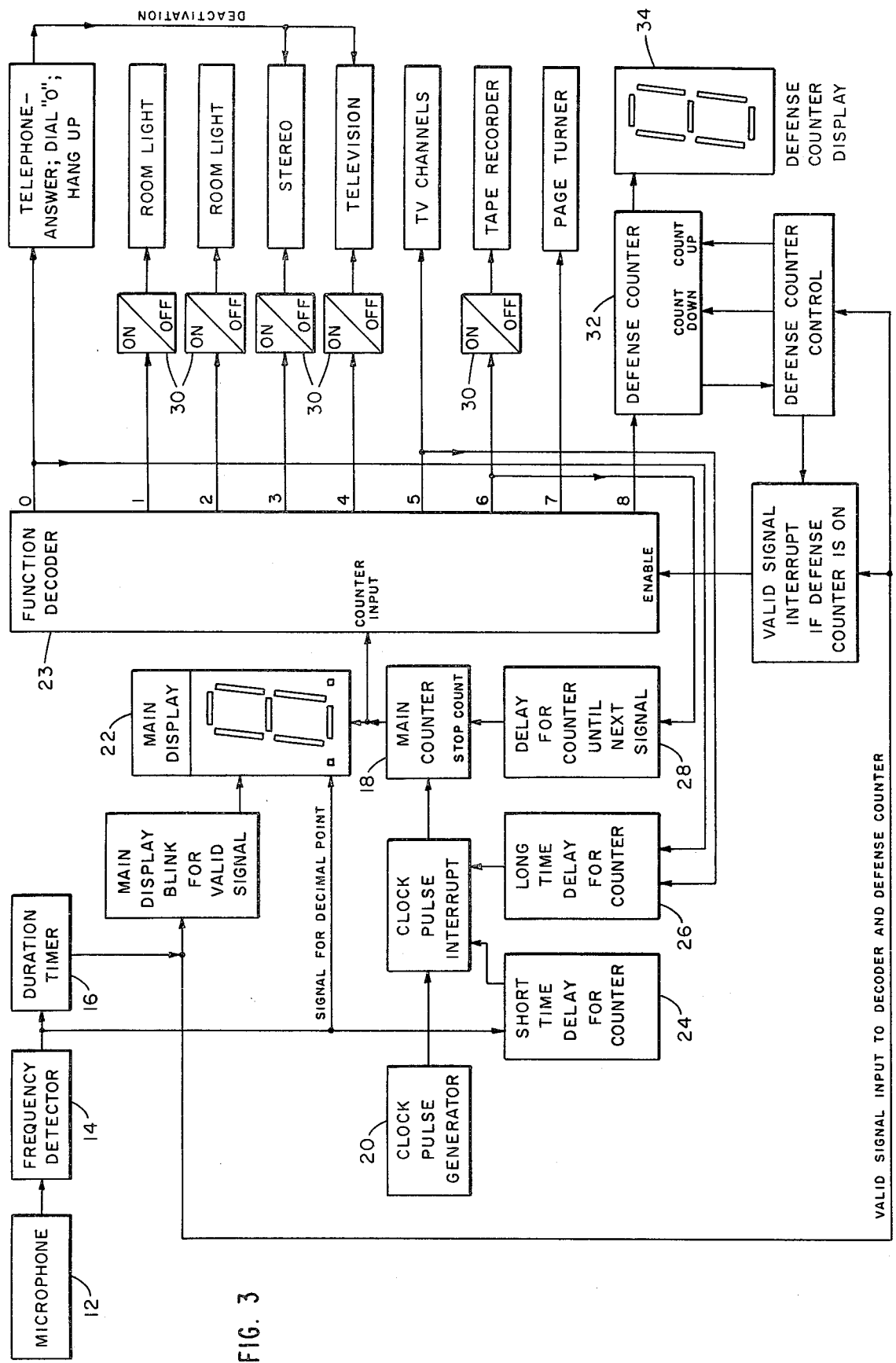
FIG. 3 is a general functional "logic" diagram of the circuit.

A broad over-view of the operation of the receiver is shown schematically and in terms of general functional blocks in FIG. 3. When the user desires to command a given function, he makes a whistle sound. This is most conveniently done with the mouth and lips, but other means such as a plastic whistle mounted on an adjustable arm are feasible. The whistle sound is received by the microphone 12, amplified and thereafter detected by a frequency or tone detector 14. If the frequency of the whistle falls within the frequency range of the detector 14, the detector 14 passes a signal on to a duration timer 16. In the illustrative embodiment, the response range of the frequency detector 14 is usually between about 900 Hz and 1100 Hz, but this can be varied to accommodate the most natural whistle tone of the user. The duration established for timer 16 is 750 m/sec., which likewise is variable to suit the preference of the user. The values selected for the illustrative embodiment represent a good balance between false signal immunity on the one hand and convenience to the user on the other. They are sufficient to avoid false signalling in the presence of all normal ambient noise. They are not, however, sufficient to prevent false signalling during a radio, television or other program which may contain sustained flute sounds or sirens. Special measures to cover such cases are described below.

When the signal passes through the tone detector 14 and duration timer 16, it is treated by the receiver as a "valid signal". Valid signals are then employed to activate the various functions as follows. A counter 18 driven by clock pulses from clock pulse generator 20 continuously cycles digits on a main display 22 changing in sequence from 0 to 8. As each digit is displayed, a circuit corresponding to that number is enabled, and if a valid signal appears at the same time, the function associated with the digit is activated. In FIG. 3, DECODER 23 is shown to illustrate the function of actuating an appliance when a valid signal appears simultaneously with the display of a digit.

The functions controlled in this embodiment are (0) telephone: (1) room light; (2) second room light; (3) stereo; (4) television; (5) TV channel selection; (6) tape recorder; (7) page turner; and (8) defense counter.

In order to make it easier for the user to transmit a valid signal, as soon as the frequency detector receives a signal of sufficient amplitude within the correct frequency range, it transmits a signal to the main display 22 for the purpose of illuminating a decimal point thereon. In addition, at the same time a short time delay 24 for the counter 18 is actuated and serves the purpose of interrupting the passage of clock pulses to the counter 18 for a period of 1 to 2 seconds after the receipt of a signal from tone detector 14. The purpose of the short time delay 24 is to cover the case where the user's whistle drifts off frequency or terminates before the expiration of the 750 m/sec of the duration timer 16. It effectively holds the display at a given number for a period sufficient to let the user adjust the frequency of his whistle and hold it long enough to complete a valid signal.

In other cases after the successful completion and processing of a valid signal, it may be desireable to deactivate the counter temporarily. For instance, in the telephone function, it may be desireable to issue the command for the apparatus to dial "operator". This is done by transmitting a second signal while the display a held at 0. This is accomplished by the use of a "long counter delay" 26 which is activated at the same time as the telephone function is activated. The long counter delay 26 interrupts the cycling of the counter 18 for a predetermined period, preferably about 15 sec. The long counter delay 26 is also useful in conjunction with function no. 5, the TV channel changer, and as well as no. 7, the page turner to give the user time to see whether a second function is desired.

Still another form of interruption of the counter is provided by "delay counter until next signal" 28. This is particularly useful for controlling appliances such as tape recorders which the user may wish to stop at a precise instant without waiting for the display 22, to cycle around to the appropriate number. The appliance may be activated by a signal which is received simultaneously with the display of the corresponding digit and deactivated by a second signal received while that same digit is on the display. In this case, if accurate and immediate deactivation is desired, the display must be frozen at the relevant digit so that there will be no need to wait for the digit to come up on the display; thus deactivation can be done at will and instantaneously. This is done by placing a signal on the "stop count" input to the counter 18, until a second signal is received.

In the usual case for functions such as No. 2, room light; No. 3, stereo; and No. 4, television, the commands are simply alternate commands of "turn on" and "turn off". Performing these alternatively is accomplished by the use of toggle type flip flops 30 whereby each successive signal reverses the command of the previous signal.

Another desireable function is to turn off other programs while receiving a telephone message. This is done by automatically deactivating functions such as stereo, TV, and the like, while the telephone is in use. Another desireable function is to prevent the processing of valid signals at certain times, for example, while listening to certain programs, which may contain a number of signals of the correct frequency and duration. The receiver will, of course, treat such signals as valid, and unless measures are taken to prevent action, the receiver will perform control functions in response thereto at an unwanted time. In order to prevent such signals from activating controls, a "defense counter" 32 having a display 34 is used. What is does, essentially, is interrupt the transmission of valid signals to the decoder, 23, until a predetermined number of valid signals have been received. The defense counter 32 is activated by a valid signal received while no. 8 is present on the main display 22. Thereafter, the defense counter accumulates a count and displays it for each valid signal received while the main display is on no. 8. In this way the user can "load" the defense counter with up to nine counts. Thereafter, as each valid signal is received while the main display is on any number other than no. 8, the defense counter 32 subtracts one from its count and displays same on the defense counter display 34. When the defense counter returns to 0, valid signals are again allowed to pass to the decoder 23, and normal operation resumes. If during a program, the user observes the defense counter number approaching zero, he need only wait until the main display cycles around to No. 8 and enter as many valid signals as he wishes to reload the defense counter. Conversely, at the end of the program, he can simply enter valid signals while the main display is not on No. 8, thereby subtracting numbers from the defense counter, and continue to do so until he deactivates the defense counter.

Numerous minor functions have been omitted from FIG. 3. For example, each time a valid signal is accepted for actuation of a function, it is necessary to maintain that signal in the on condition for sufficient time to permit the control relay to respond. Usually 100 m/s is sufficient for this and a "minimum on" timer is used for this purpose.

Also, additional digits can be added to the counter and main display and additional functions can be added corresponding thereto. For example, an automatic telephone dialing system having a capacity of storing up to sixteen telephone numbers can be added by the use of seven additional digits, i.e. 9 and A to F.

Accordingly, FIG. 3 should only be taken as being broadly illustrative and not as limiting in any way.

DETAILED CIRCUIT DIAGRAM OF ILLUSTRATIVE EMBODIMENT

The functions described in the foregoing general functional description may also be performed in various ways. However, a suitable circuit diagram for a detailed description of the illustrative embodiment is shown in FIGS. 4 to 10.

The circuit diagram is divided into six basic components as follows:
Signal input processing system (FIGS. 4 and 5)
Main logic (FIG. 6)
Phone System (FIG. 7)
Defense Counter (FIG. 8)
Master Clear (FIG. 9)
Test Indicators (FIG. 10)

Basically, the system employs TTL logic components employing a common +5V source and a logic "1" of 2.4 volts and above. Solid state integrated circuits (IC's) are employed and are identified in the description by the letters IC followed by a number. In many cases, more than one function is contained within a given IC chip. These are distinguished from each other in the description by letters a, b, c, etc. following the IC number.

Figure 4:
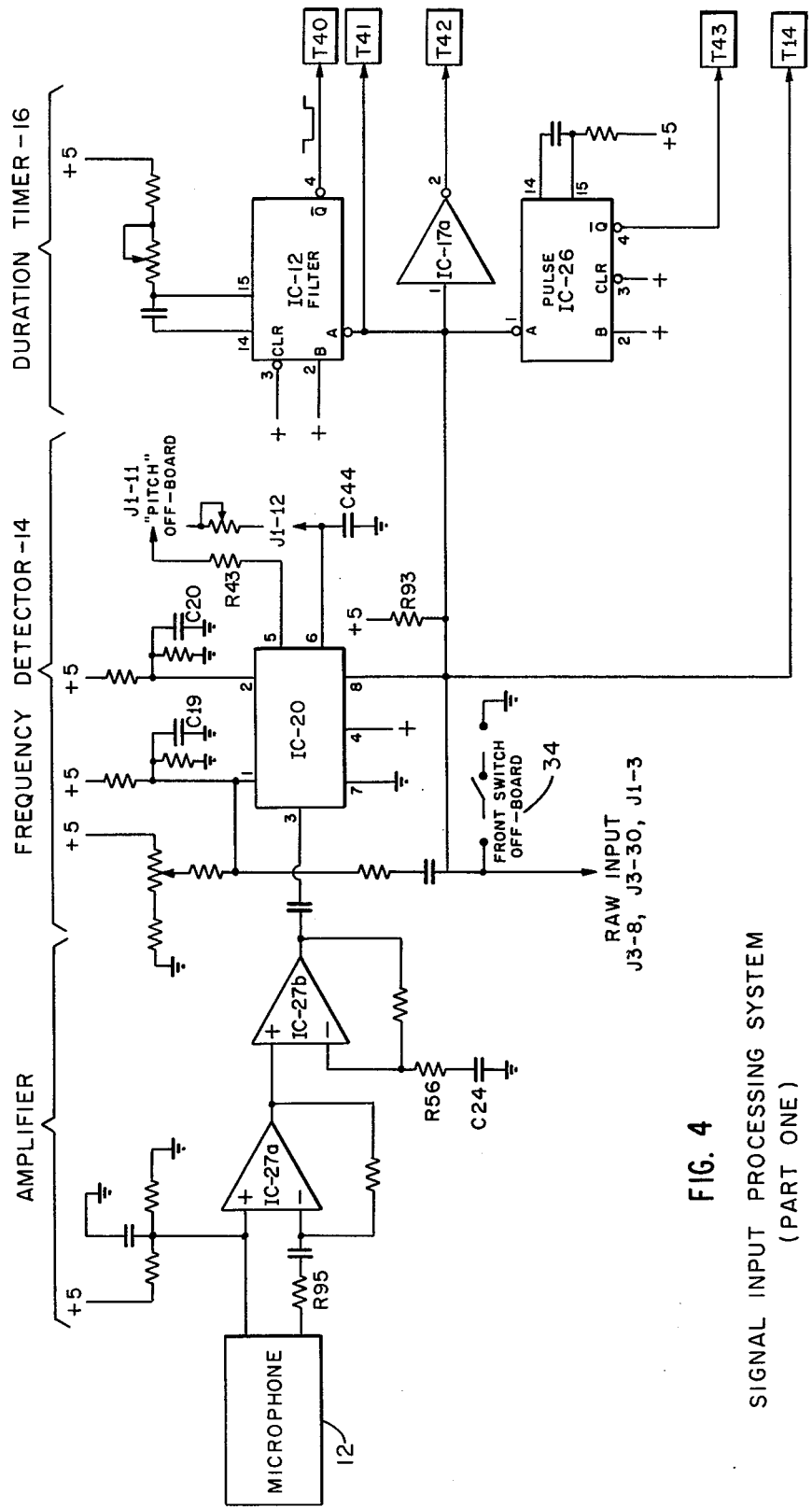
FIGS. 4 and 5 are circuit diagrams of the signal input processing system.
Figure 5:
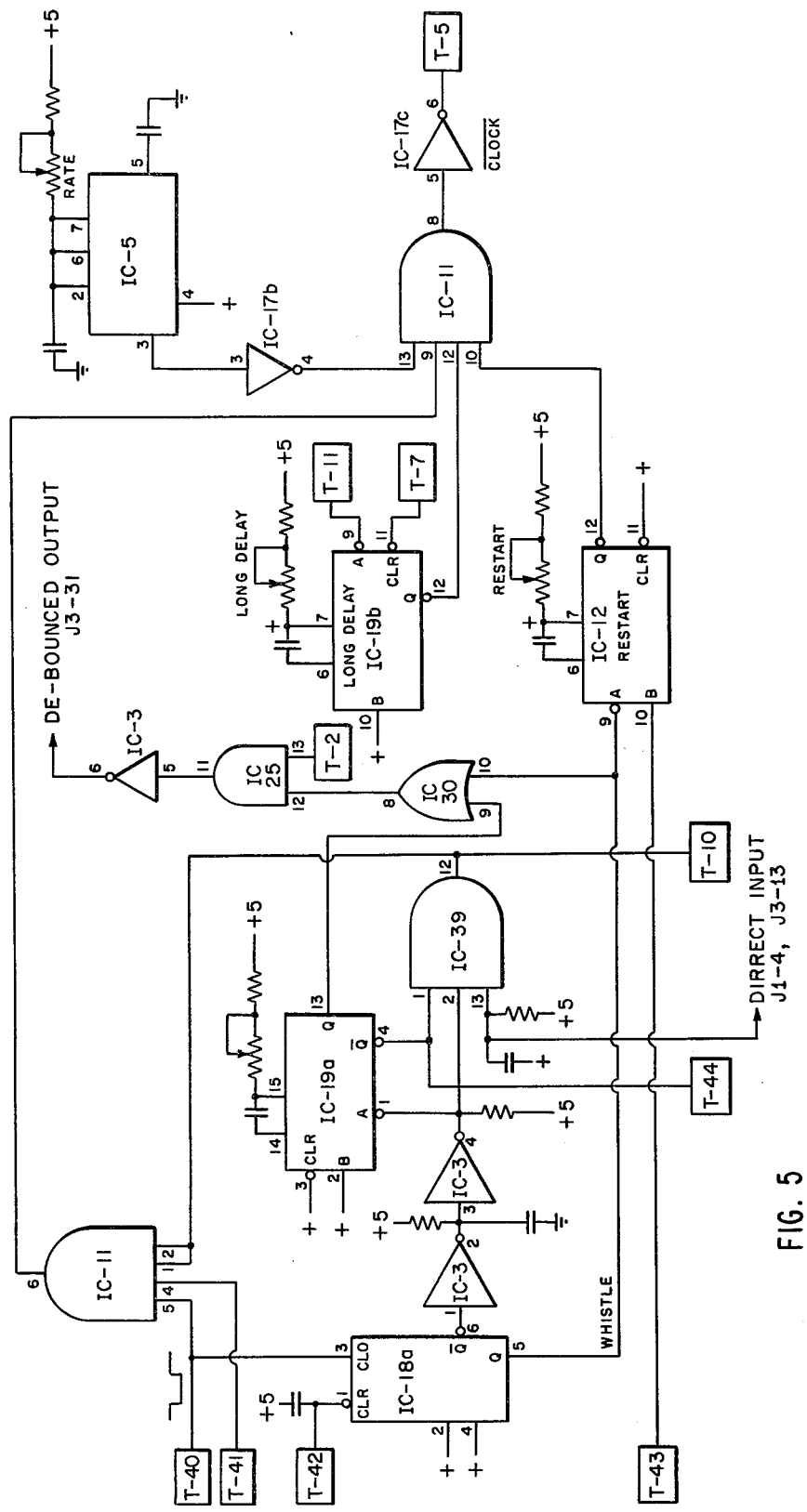

The signal input processing system is shown in FIGS. 4 and 5. The principal source of signals is a microphone 12, the output of which is amplified by a first stage of operational amplifier IC 27 (National Semiconductor LM 324). The impedance of microphone 12 is employed along with a 500 ohm series resistor R95 to set the gain of the amplifier at about 1000. A second stage of amplifier of IC 27b may be employed as a voltage follower, or as a second amplification stage if desired, by inserting R56 ad C24. Various other capacitors and resistors associated with the IC's described herein are conventional and need not be described in detail although they are shown in the drawings.

The amplified signals from the microphone 12 are fed to a frequency detector (otherwise called a "tone decoder") IC 20. (Signetics #NE 567). It is normally capable of responding to signal levels above 100 Mv peak to peak, but a whistle tone of normal amplitude will be amplified by IC 27 to a level of about IV, well above the minimum response level required for frequency detector IC 20.

The frequency band width of IC 20 is determined by capacitor C 20 (at pin 2). Normally this is set to give a bandwidth of about 10% for frequencies in the neighborhood of 1000 Hz. Capacitor C 19 (at pin 1) determines the length of time required for IC 20 to lock onto the incoming frequency once a signal of sufficient amplitude within the correct frequency range of IC 20 is being received.

IC 20 includes a voltage controlled oscillator (VCO) whose center frequency is determined by external resistance R43 (at pin 5) and capacitor C 44 (at pin 6) along with an adjustable "pitch" resistor. In the illustrative embodiment they are set so that the VCO will respond to a center frequency of 1000 Hz (±10%).

The frequency of the VCO appears as a square wave at pin No. 5 of IC 20, and can be used for test purposes to check the frequency response range at which IC 20 is set. During the transmission of a whistle signal, if the frequency varies, the VCO will follow it within the limits of the detection band. This is important because it means that the user need not hold an extremely accurate pitch of his whistle as long as it does not vary more than 10% from the center frequency of the VCO. Likewise he need not start with a whistle tone of precisely 1000 Hz in order to induce the VCO to lock onto his signal. These are matters of significant convenience to the user.

When the VCO of IC 20 locks onto the incoming signal, the voltage at pin 8 which is normally high at logic "1" (+5V), shifts to logic "0". The logic "0" output at pin 8 of IC 20 is used to indicate that a signal of the correct frequency is being received. Other sources of a similar indication are, of course, possible. For example, the closing of a microswitch can also be used to initiate a command signal. Therefore, at this location in the circuit, input terminals J3-8, J3-30, and J1-3 are provided. In addition, a switch is provided in the front panel to simulate the reception of a command signal in order to facilitate manual operation by people other than the usual operator. The +5V source is applied through resistor R93 to bring the line up to logic "1" during quiescent periods.

The negative edge of the logic "0" output at pin 8 of IC 20 triggers a monostable multivibrator ("one shot") (Texas Instruments # SN 74123) IC 12, the external RC components of which are set to provide a negative going (logic "0") signal of 750 m/sec duration. The logic "0" signal from IC 20 is also inverted by IC 17 a and then used to enable flip-flop IC 18a (Texas Instruments #SN 7474) (see FIG. 5) which, when enabled, is triggered by the positive edge of the signal appearing at the termination of the 750 m/sec logic "0" signal of IC 12. When so triggered, the output of pin no. 6 of IC 18 becomes a logic "0" signal and indicates that a signal of the correct frequency has been sustained for at least 750 m/sec. If the whistle signal stops before the end of the 750 M/s, the output at pin no. 8 of IC 20 will rise to logic 1. This will, in turn, be converted to a logic "0" by inverter IC 17, and will serve to clear IC 18a such that there will be no logic "0" output at pin no. 6 of IC 18a when one shot IC 12 "times out". Conversely, if the whistle stops briefly but then resumes, a second negative edge pulse from pin no. 8 of IC 20 will be applied to one shot IC 12. This retriggers IC 12 such that it will not "time out" until 750 m/sec after the latest logic "0" signal from IC 20. Since a valid whistle signal is indicated only when a logic "0" signal is present at pin 6 of IC 18a, whistles of less than 750 m/sec are effectively filtered out. In addition, the arrangement effectively also filters out any short voltage spikes or noise emanating from the circuitry or from microswitches in the event that other forms of input are used.

Transitions of connections from one figure to another are indicated by the letter T plus a number enclosed in a box.

In addition to triggering the one-shot IC 12, the logic "0" transition of the tone decoder IC 20 also triggers the "pulse" one-shot, IC 26, which (through T43 to FIG. 5) in turn triggers the "restart" one-shot, IC 12. This timer (through IC 11) causes the counter to stop sequencing momentarily. This is done so that in the event that the operator was only able to activate the tone decoder for a short time, he will have an additional few seconds to try to activate the tone detector for a period sufficient to pass through the duration timer as explained above. The "restart" timer also is activated after the operator has succeeded in creating a "valid input", which for example, might have turned on a room light. At the end of the "valid input", the output, pin 5 of IC 18a will return to a logic "0" thus triggering the "restart" one shot through the input at pin 9. The counter is now delayed a few seconds from changing, thereby giving the operator time to issue the same command. Thus he could turn off that same room light without having to wait for the main display to cycle around to the same command number. This allows the user time to undo commands issued by mistake, or time to issue subsequent commands without having to wait for the display to return to the desired number. These two distinct conditions for triggering the "restart" timer—inputs too short to pass through the duration timer, and after the end of those signals that do pass through the duration timer—are a matter of important convenience to the user.

Since valid signals are indicated by IC 18a, it is important to make sure that any logic "1" to logic "0" transition appearing at pin 6 of IC 18a for any sufficient length of time can be used effectively by the receiver. This is done by the "minimum on" one shot IC 19a (Texas Instruments #SN 74123). If the logic "0" signal at pin 6 of IC 18a is on long enough to get through the buffers IC 3, IC 19a is triggered and its external RC components are set so that it transmits a logic "0" signal at its pin no. 4 for a duration of approximately 100 m/sec. This signal insures that a valid signal will remain on within the receiver for at least 100 m/sec even though the actual whistle may have terminated earlier. This is necessary to provide sufficient time for control relays to be actuated. The output of the "minimum on" timer IC 19a also is used to blink the main display to indicate reception of a valid signal via terminal T44 as will be explained further below. In addition, outputs of buffers IC 3 and IC 19a are combined to provide a "valid signal line" at terminal T10.

In parallel with the foregoing arrangements for identifying valid signals, a direct input line from pin 8 of IC 20 is connected (via T41 from FIG. 4 to FIG. 5) to IC 11 (appearing in two places in FIG. 5, upper center and lower right). IC 11 (Texas Instruments #SN 7421) checks for any condition which should interrupt the transmission of clock pulses to the main counter such as (a) the presence of a logic "0" signal at pin 8 of IC 20 prior to the timing out of IC 12, (b) the "minimum on" IC 19a not being timed out, (c) the "long delay" (to be described) not being timed out, and (d) the restart being in triggered condition (to be described).

The logic "0" output of IC 20, in addition, is transmitted via T-14 directly to the main display (to be described) to activate the illumination of a decimal point to inform the user of the reception of a signal of the correct frequency prior to its reaching "valid" status.

Clock pulses are generated by a clock pulse generator IC 5 (Signetics #NE 555) arranged with an external RC network for generating pulses at a frequency of about 1 Hz which are transmitted via buffer IC 17b, through IC 11 when not otherwise interrupted, through buffer IC 17c and on to the main logic system presently to be described.

The signal input processing system described in FIGS. 4 and 5 provides output on two lines; (a) the "valid signal" line at T-10 and (b) the clock pulse line at T-5. The valid signal line is an active low (logic "0") line which indicates that a signal of the correct duration and frequency has been received. In addition, by operation of IC 19a, the signal in the valid signal line has a duration of at least 100 m/sec. even though the actual signal may terminate earlier. The clock line transmits clock pulses to the main counter IC 36 (see FIG. 6) via buffer IC 37a (Texas Instruments #SN 7407) which enables the main clock line to become an I/O (input-/output) line by virtue of an open collector arrangement in the buffer IC 37a. The main logic system next to be described employs the signals in the valid signal line and the clock pulses in the clock line to determine which outputs will be affected and, thereby, which appliances will be controlled and how.

MAIN LOGIC SYSTEM

The main counter IC 36 (Texas Instruments #SN 74161) is enabled by the presence of logic "1" signals at its pins 7 and 10, and when enabled, it advances one count on the positive edge of each clock pulse received. Its output of counter IC 36 is routed to various components as follows (a) to a display driver IC 6 (Fairchilds Semiconductor #9370), (b) to a first decoder IC 31 (Texas Instruments #SN 74155), (c) to a second decoder IC 7 (Texas Instruments #SN 7492), (d) to output buffers IC 37b, c, d, and e, and (e) to three separate gates in IC 38a, b, and c (Texas Instruments #SN 7410). These gates detect three conditions respectively; Count=9, Count=A, and Count=C. When these gates are enabled by the input lines being at a logic one, their output goes low if the count condition is satisfied. With all the gates enabled, the first one that will go low is the one that senses Count=9. This will clear the main counter immediately (via AND gate IC 39b (Texas Instruments #SN 7411)). The effect is therefore counting from 0 to 8. If the gate is disabled by driving the "count to 9" line low, the next gate will sense a count=A and clear the counter immediately after 9. To make the circuit count to "B", both the "count to 9" and the "count to B" lines must be grounded. Now, the last gate will sense a count=C and clear the counter immediately after B. Grounding all three inputs to IC 38 allows the binary counter to count normally, and it therefore counts to F. These latter options are not used in the illustrative embodiment, but they are available for controlling additional functions if desired.

Most control decisions are made by IC 31, which is wired as a 3 line to 8 line decoder with enable. The eight different control outputs are normally at logic "1" (high), but one will go to logic "0" (low) corresponding to the 3-bit binary number input if the enable lines, at pins 2 and 14 of IC 31 are driven low. For example, if the counter is equal to 4, and a whistle signal is received and processed, and no. 4 output line, pin 7, will go low. This will trigger the flip-flop IC 24a (Texas Instruments #SN 7476) immediately, and the output device corresponding thereto at J2-4 will change state.

Since the decoder is being fed part of a 4-bit binary number, the highest bit is OR'ed with the other enable lines so that counts above 7, which will be characterized by the "D", or most significant bit being a logic one, will not operate the decoder, since the enable line is held high. At IC 34 (Texas Instruments #SN 7400) (to the right of decoder IC 31), two conditions can put a logic "1" into OR gate IC 30a (Texas Instruments #SN 7432) which will inhibit the decoder IC 31. Pin 2 of IC 34 is connected to the "defense" system (to be described) via T-2 and will be low unless the counter, IC 8 in the defense counter is at count=0; this will be explained in more detail later. If pin 1 of IC 34 is held low, a logic "1" is present at the output of the gate, and decode is inhibited.

IC 41 (Texas Instruments #Sn 7476) contains two flip-flops IC 41a and IC 41b which control relays corresponding to display numbers 6 and 7 through the drivers, IC 28a and b. The flip-flops trigger on the negative edge of the signal. The operation of these devices is slightly different than flip-flops IC 23 and IC 24. The flip-flops IC 41a and b trigger in the normal manner, but SW 1 and SW 2, associated therewith, determine whether the relays see a momentary, or on-off signal. When either switch is open, the signal that goes to the relay is simply the signal to the flip-flop (from the decoder, IC 31), which is a momentary low for the duration of the whistle. With the switch closed, the flip-flop output is ANDED with the input signal, so the relay is on either if the flip-flop is on or if the input signal is low. In this case, the relay will operate as an on-off; it will go on at the beginning of the whistle, and off after the end of the next whistle.

Figure 6:
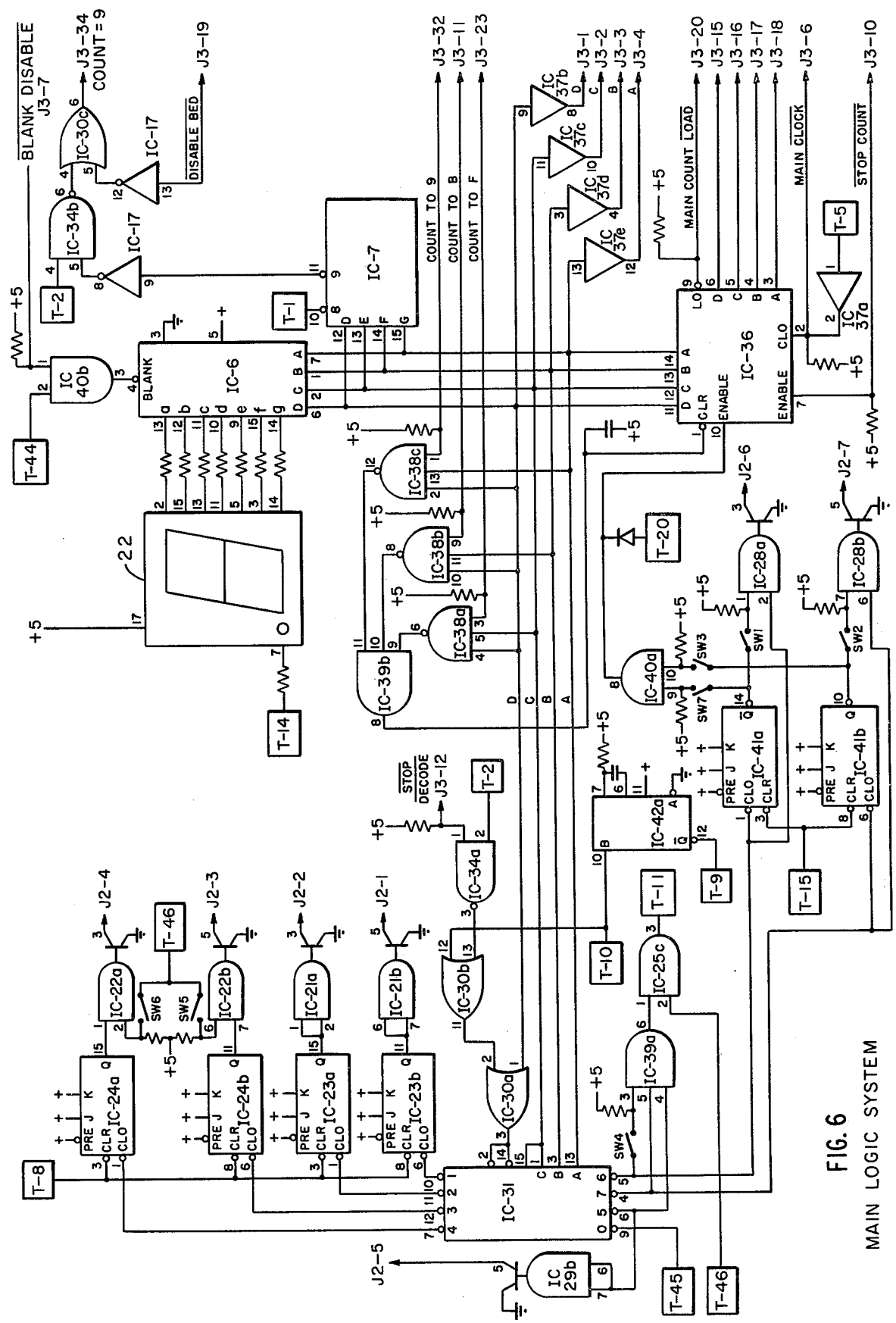
FIG. 6 is a circuit diagram of the main logic system.

The AND gate, IC 40 (Texas Instruments #SN 7408), located above the flip-flops in FIG. 6), controls an active high enable for the counter IC 36. A low on either input, therefore, disables the counter. The inputs to the gate (IC 40) come from SW 7 and SW 3 associated therewith, which are programming switches which allow the output of the flip-flops to be connected to the AND gate (IC 40). This is called the "stop count" feature (referred to in connection with FIG. 3 as "delay for counter until next signal"). It works as follows. Whistling at 6 or 7 (depending upon which one is set for "stop count") will turn on the associated flip-flop of IC 41, driving the enable line low through the switch then the gate to the counter. This means that while the "stop count" function is activated, the counter will not change. With the "stop count" feature activated by closing one of the switches, the tape will playback after the first whistle, and the counter will remain on the same digit. Once the user stops the tape, the counter will continue.

In FIG. 6, (below and to the right of the main decoder IC 31), there are two gates IC 39a and IC 25a (Texas Instruments #SN 7408). These gates are used to trigger a "long delay" one shot, IC 19b (see FIG. 5) via terminal T-11, in response to signals from the main decoder IC 31 corresponding to certain decoded numbers. As shown, a switch no. 4 controls the output from IC 31 corresponding to no. 6, and when closed, allows the output on the no. 6 line to pass to gate IC 39a which, in turn, is transmitted to and triggers the long delay one-shot IC 19b via gate IC 25a and T-11. The RC network of the long delay one-shot, IC 19b, is set to provide a signal of 15 seconds duration which is applied to IC 11 for the purpose of interrupting the passage of clock pulses to the main counter IC 36 for that period of time. Since decoded nos. 5 and no. 7 correspond respectively to the "TV channel selection", and "page turner" functions, these functions are accompanied by a "long delay". If desired, the decoder no. 6 can be accompanied by a "long delay" if switch no. 4 is closed.

Relays for control functions nos. 1–7 are driven by signals from the main decoder IC 31 via ICs 21, 22, 29, and 28 respectively.

Figure 7:
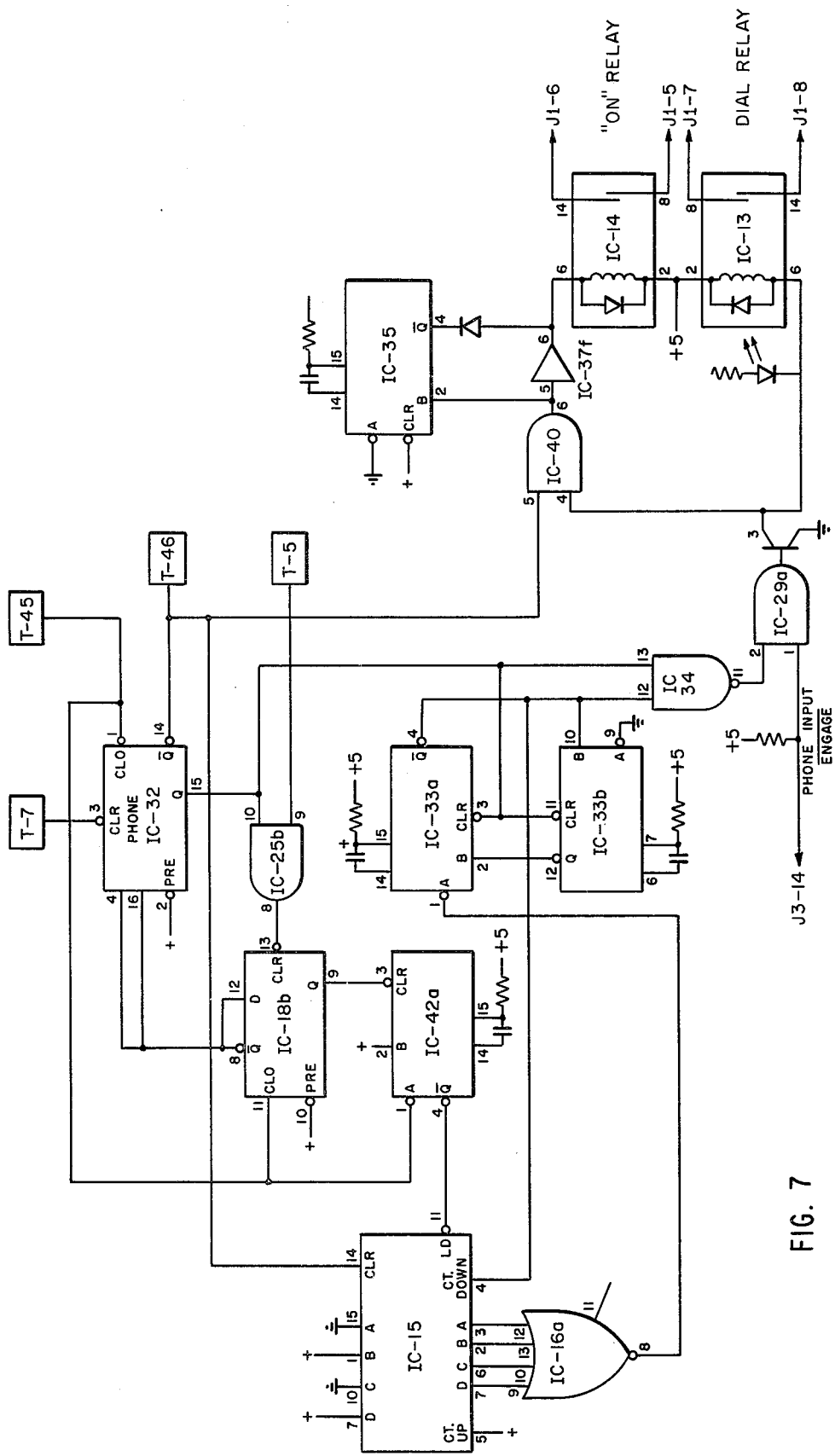
FIG. 7 is a circuit diagram of the phone system.

The circuit diagram for the telephone system is shown in FIG. 7. It is designed to answer the phone, by activating a telephone on receipt of the first valid signal while the counter is on zero and simultaneously activating the long delay IC 19b. If a second valid signal is received before the long delay clocks out, the phone system is adapted to dial 10 pulses to obtain the "operator". A third valid signal thereafter will hang up the phone.

Prior to the receipt of a first valid signal at count zero, and during normal cycling of the counter IC 36, clock pulses are also being routed to the phone system via T-5 to IC 25b. These pulses are used to clear flip-flop IC 18b which, when cleared, presents a logic "1" at its pin no. 8 which is connected to the J and K pins of a "phone" flip-flop IC 32 (Signetics #N 74H106), and also to the "D" connection (pin 12) of IC 18b. In this condition, when a first valid logic "0" signal is processed through decoder IC 31 to the phone system, while the main counter IC 36 is on zero, the phone IC 32 is triggered by the negative going edge of the logic "0" signal. Since its J and K connections are at logic "1" at that time, pin 14 of IC 32 goes to logic "0", and pin 15 goes to logic "1". This activates the "on" relay of the phone, IC 14, (via IC 40 and driver IC 37) as well as the "dial" relay IC 13 (via IC 34 and driver IC 29, Signetics #SN 75451).

The first valid signal also is applied to pin 11 of IC 18b but because it is positive edge triggered, nothing happens to IC 18b during the logic "0" phase of the valid signal until the end of the valid signal at which time it returns to logic "1" and thereby triggers IC 18b. This drives pin 8 of IC 18b to logic "0" and consequently the J and K connections of IC 32 as well as the the "D" connection, pin 12, of IC 18b to logic "0. IC 18b also simultaneously enables a "pulse" one shot IC 42 via pin 9 of IC 18b and pin 3 of IC 42.

At this point the phone is on and is being answered if there is an incoming call, or, if not, the dial tone is on.

Provision is made at IC 29 for injecting dial pulses from an external source and, therefore, it is necessary to activate the "on" relay and the "dial" relay simultaneously. However, to prevent the "on" relay from going on and off while the "dial" relay is pulsing, a one-shot IC 35 (Texas Instruments #SN 74125) is employed. IC 35 triggers on the positive edge of dial pulses emanating from the external source through driver IC 29 (via IC 40), and the external RC network of one-shot IC 35 is set to provide a pulse of sufficient duration to hold the "on" relay in energized condition during the "open" times of the dial relay (IC 31). A diode is employed in series with pin 4 of IC 35 to prevent shorting the normally high Q output thereof during normal operation.

In addition, at the receipt of the first valid whistle signal, the logic "0" signal at pin 14 of IC 33 (Texas Instruments #SN 74123) is also transmitted to the long delay IC 19b (FIG. 5) (via T-46, IC 25 and T-11). IC 19b is designed to interrupt transmission of clock pulses for sufficient time to allow the user to employ one valid signal to answer the phone and a second one to dial the operator. Accordingly, during the period of IC 19b, no clock pulse signals are coming to the phone system via T-5 and IC 25, and IC 18b is not cleared. Thus if a second valid whistle signal is received before the long delay IC 19b times out, since the J and K connections of IC 32 are at logic "0" nothing happens at IC 32 and the phone remains on. However, at the end of the second valid signal, IC 18b again triggers and returns the J and K terminals of IC 32 to logic "1", and thereafter if a third valid signal occurs, IC 32 changes state and "hangs up" the phone. Also, once the long delay has timed out, clock pulses again start arriving at T-5 and they clear IC 18b. This has the same effect as the second valid signal before the long delay times out, namely to place the J and K terminals of IC 32 at logic "1" which prepares IC 32 for a change of state (i.e. to "hang up" the phone) on the next valid signal.

Upon receipt of the second valid whistle before the long delay IC 19b has timed out IC 42 (Texas Instruments #SN 74123) (which was previously enabled by IC 18b on the first valid signal) transmits a "load" pulse to a "down counter" IC 15 (Texas Instruments #74193). Down counter 15 is normally a binary 0000 (0), but when the load pulse from IC 42 appears, it is preset to 1010 (10). This drives NOR gate IC 16a to logic "0", which in turn triggers IC 33a, the RC network of which is adapted to provide a pulse of 65 m/sec duration. This pulse opens the dial relay (IC 13) (Gordos 831-A2) for 65 m/sec, and on its rising edge (at the end of 65 m/sec), it both clocks the down counter IC 15 down one, and triggers the one-shot IC 33b. This latter one-shot is set to provide a pulse of 39 m/sec to serve as the period between dial pulses. When the 39 m/sec one-shot IC 33b times out, IC 33a triggers again, and so on until the count on IC 15 is reduced to zero, at which time pin 8 of NOR gate IC 16a (Texas Instruments #SN 7425) is driven to logic "1" which stops further triggering of IC 33a. The result is to provide 10 dial pulses for dialing the "operator".

Referring now at flip-flops IC 23a and b and IC 24a and b (Signetics #N 74H106) (located above the main decoder in FIG. 6), and in particular to the switches associated with the drivers IC 22a (Signetics #SN 75452) and IC 22b which are actuated respectively by ICs 24a and b, (assume both switches are closed), the driver is on if both of its inputs are at logic 1. The input to the switches comes from the phone flip-flop IC 32, and this line is at logic "0" if the phone is on. The effect of this is to turn off the relays associated with counts =3, and 4 if the phone is on. As described, the stereo and television are controlled by these outlets, and such interference as they would cause with a speakerphone conversation is thereby eliminated automatically when the phone is turned on. When the phone is turned off, the signal from IC 32 returns to logic "1" and drivers IC 22a and b are again in condition to be actuated by a logic "1" signal from flip-flops IC 24a and b respectively such that, if they are in the "on" condition the stereo or television will come on again. Opening the switches disables this function for those who don't want it as might be the case if devices other than a TV or stereo were plugged into outlets 3 or 4.

The decoder, IC 7 (located just above the main counter in FIG. 6), operates on numbers above 7 which cannot be handled by the main decoder. When the count is at 9, and the disable bed input is 1, the count=9 line will be low if the defense counter (about to be described) shows zero. By using this output, all that is needed to make a bed control is an up/down flip-flop and the necessary drivers.

The "defense system" is shown in FIG. 8. It provides the user with a means to protect the receiver from signals of the correct frequency and duration which may emanate from sources other than the user's whistle. In order to activate the defense system, when the main display shows no. 8, the user whistles, and on the end of the whistle a pulse appears pin 12 of IC 42a (just to the right of the main decoder IC 31 in FIG. 6). This pulse is transmitted to the defense system via T-9, where it is used to clock the defense counter, IC 8 (Texas Instruments #SN 74190), advancing it one count for each pulse. Subsequent valid whistle signals while the main display is still at no. 8. additionally advance the defense counter IC 8. Valid signals coinciding with the display of any other number are employed to reduce the count by one. In this manner, the user can protect the receiver from false signals after turning on the television, and can replenish the number of counts loaded into the protective circuit by creating valid signals while the main display is at count 8. Using this arrangement, instead of the television being turned off for example, by sirens that occur perhaps at the most exciting part of a TV show, the defense counter will harmlessly count down one, and no control outputs will be affected. When the defense counter display is at zero, it blanks out, and the receiver is ready to continue in the normal manner.

The defense system operates as follows. When count=8, the decode line at IC 7, pin 10 (see FIG. 6) is low. This drives IC 40, pin 11 low, (through T-1), enabling the counter IC 8. It also sends the DN/UP line, pin 5 of IC 8 low, which sets the counter IC 8 to count up. Assume, for example, that the counter IC 8 shows "2", if the decode line is high, i.e. count is not equal to 8, DN/UP is high, which will set counter IC 8 to count down. At that point the enable connection for IC 8 is low, because the NOR gate, IC 16b is low, since the count of counter IC 8 is not equal to 8. So, when the whistle input occurs, it triggers the pulse one-shot IC 42b, which clocks the counter IC 8, and causes it to count down one. When the counter IC 8 reaches zero, it becomes disabled because the NOR gate is now showing a logic one, and the enable input is also at logic one. Now that the defense counter is at zero, it can only count when the main counter shows 8, which enables the defense counter and allows it to count up.

It will be seen that there are two driver IC's, IC 19 (Texas Instruments #SN 7447) and IC 10 (Fairchild SemiConductor #9370) for the same display digit. IC 9 takes care of displaying the numbers of the defense counter, and IC 3, pin 12 puts a tail on the "6". The other driver, IC 10 is used to display numbers on the defense counter display coming in via external lines. It must only be used when IC 9 is blanked out, otherwise the digit being displayed will not make any sense.

The test indicators, IC 3 (Texas Instruments #SN 7406) (see FIG. 10) are used for servicing, or as extra state indicators. The inverting buffers will turn the LED on when the input is a logic one.

The master clear (See FIG. 9), IC 26 (Texas Instruments #SN 74123) is in the lower left and it triggers when the supply comes on. This master clear resets all flip-flops, counters, etc. to zero, so the machine starts in a known condition.

A conventional regulated power supply is used and therefore need not be described.

Although the system described above employs single signals of a given duration within a given frequency range, it will be understood that various combinations of signals employing different durations and/or frequencies may be used with appropriate discriminating and timing circuits without departing from the spirit of the invention. Thus, a series of command signals may be coded to convey specific information and commands to the receiver. Moreover the coding may be in the form of signal trains of varying numbers of impulses, varying durations thereof, and/or different distinctive frequencies; and as long as the receiver responds to a preselected duration of at least one component of the coded signal and transmits a signal back to the transmitter indicating that such component has been received for said preselected duration, the mode of operation of the invention will be employed. Accordingly in the claims, the use of the term "coded signal" is intended to mean not only a single "duration coded" signal but also any one or more of the other methods of coding and transmitting command signals to the receiver.

Various modifications of the foregoing illustrative embodiment will now be apparent to those skilled in the art, and, therefore, is not intended to confine the invention to the precise form shown, but rather to limit it according to the appended claims.

I claim:

1. Apparatus for remotely controlling automatic apparatus by means of a user operated transmitter comprising:
   (a) means for controlling the frequency of the transmitter;
   (b) a receiver for receiving signals from the transmitter within a predetermined frequency range;
   (c) means at the receiver for detecting receipt of a signal within the predetermined range and for transmitting back to the transmitter a signal indicating such receipt;
   (d) means at the receiver for detecting the duration of a signal received within the predetermined frequency range and for indicating when such a signal has been continuously so received for a predetermined period, and
   (e) means at the receiver responsive to signals detected as defined in (c) and (d) for energizing controls,
   whereby the user adjusts the frequency to come within the receiver's range, the receiver informs the user when the frequency is correct, thereafter the user holds the signal for the predetermined duration and the receiver informs him when he has succeeded in so doing.

2. The apparatus defined in claim 1 further characterized by the transmitter being a transmitter of sound.

3. The apparatus defined in claim 1 further characterized by the transmitter being a human whistle.

4. The apparatus defined in claim 1 further characterized by the receiver including a microphone for receiving sound.

5. The apparatus defined in claim 4 further characterized by the receiver including means for detecting a band of about 10% above or below a given frequency.

6. The apparatus defined in claim 5 further characterized by the detection means comprising a phase locked loop having a capture range of about 10% above or below its center frequency.

7. The apparatus defined in claim 6 further characterized by the center frequency being in the range of 500 Hz to 5000 Hz.

8. The apparatus defined in claim 4 further characterized by the means for detecting the duration of the signals being set to detect signals of a duration of about ½ sec. to 2 sec.

9. The apparatus defined in claim 1 further characterized by the frequency range of element (c) being substantially 900 Hz to 2500 Hz, and the duration of element (d) being about 750 m/sec.

10. The apparatus defined in claim 1 further characterized by means for sustaining the response of element (e) for a period sufficient to energize a relay.

11. The apparatus defined in claim 1 further characterized by element (a) comprising means for selectively generating the frequency of the transmitter.

12. The apparatus defined in claim 1 further characterized by the transmitted frequency of the transmitter being in the audio range.

13. The apparatus defined in claim 1 further characterized by:
(f) means at (b) for automatically and periodically changing an appliance controlled by (e) so that energization of controls by (e) performs a different control function, and
(g) means at (b) for transmitting a further signal back to (a) indicating which of a plurality of appliances may be controlled by (e) at any given time.

14. The apparatus defined in claim 13 further characterized by:
means for temporarily halting the operation of (f) in response to detection of said signal by (c).

15. The apparatus defined in claim 13 further characterized by:
means for temporarily halting the operation of (f) in response to detection of said signal by (c) for the predetermined period defined in (d).

16. The apparatus defined in claim 13 further characterized by:
means for halting the operation of (f) in response to detection of said signal by (d) and for reactivating the operation of (f) in response to a separate and subsequently detected signal by (d).

17. The apparatus defined in claim 1 further characterized by:
means for additionally immunizing (e) from being activated by (b), (c) and (d) in response to ambient signals not transmitted by (a) including means for deactivating (e) until a predetermined number of signals received at (b) of said predetermined duration have been detected at (d), and
means for transmitting back to (a) a signal indicating the number of signals remaining needed to activate (e).

18. The apparatus defined in claim 1 further characterized by:
means for indicating in (d) including the visible action of an appliance.

* * * * *